United States Patent
Baechtold et al.

(10) Patent No.: US 8,026,719 B2
(45) Date of Patent: Sep. 27, 2011

(54) MAGNETO-RESISTANCE BASED TOPOGRAPHY SENSING

(75) Inventors: Peter Baechtold, Gattikon (CH); Urs T. Duerig, Rueschlikon (CH); Walter Haeberle, Waedenswil (CH); Armin W. Knoll, Adliswil (CH); Charalampos Pozidis, Thalwil (CH); Deepak Ranjan Sahoo, Zurich (CH); Gian R. Salis, Aeugst (CH); Abu Sebastian, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 12/245,171

(22) Filed: Oct. 3, 2008

(65) Prior Publication Data
US 2010/0085056 A1    Apr. 8, 2010

(51) Int. Cl.
*G01R 33/00* (2006.01)
(52) U.S. Cl. .................................................. 324/260
(58) Field of Classification Search .................. None
See application file for complete search history.

(56) References Cited

U.S. PATENT DOCUMENTS

| | | | | |
|---|---|---|---|---|
| 5,936,237 A * | 8/1999 | van der Weide | .......... | 250/234 |
| 6,611,140 B1 * | 8/2003 | Bloechl et al. | .......... | 324/207.21 |
| 2002/0121897 A1 * | 9/2002 | Mukasa et al. | .......... | 324/244 |
| 2006/0043288 A1 * | 3/2006 | Binnig et al. | .......... | 250/309 |
| 2009/0224755 A1 * | 9/2009 | Kahlman et al. | .......... | 324/252 |
| 2010/0085056 A1 * | 4/2010 | Baechtold et al. | .......... | 324/345 |

FOREIGN PATENT DOCUMENTS
EP    306178 A2 *    3/1989

OTHER PUBLICATIONS

H. Li et al.; Microelectromechanical System Microbridge deflection monitoring using Integrated Spin Valve Sensors and Micromagnets; Journal of Applied Physics; vol. 91, No. 10 May 15, 2002; pp. 7774-7776.

T. Takezaki et al.; Magnetic Field Measurement Using Scanning Magnetoresistance Microscope with Spin-Valve Sensor; Japanese Journal of Applied Physics; vol. 45. No. 38; 2006; pp. 2251-2254.

M. Nakamura et al.; Scanning Magnetoresistance Microscopy with a Magnetoresistive Sensor Cantilever; Applied Physics Letters, vol. 80, No. 15; Apr. 15, 2002; pp. 2713-2715.

* cited by examiner

*Primary Examiner* — Jermele M Hollington
(74) *Attorney, Agent, or Firm* — Tutunjian & Bitetto, P.C.; Stephen Kaufman

(57) ABSTRACT

A topography sensor and method include a probe configured to traverse a surface to determine a topography. A stray magnetic field is disposed in proximity to the probe. A magneto-resistive sensor is configured so that the stray magnetic field passing through it changes in accordance with positional changes of the probe as the probe tip traverses the surface.

21 Claims, 7 Drawing Sheets

MAGNETO-RESISTANCE BASED TOPOGRAPHY SENSING

RELATED APPLICATION INFORMATION

The present application is related to U.S. application serial number 12/245,243, entitled "MAGNETO-RESISTANCE BASED NANO-SCALE POSITION SENSOR", filed currently herewith and incorporated herein by reference.

BACKGROUND

1. Technical Field

The present invention relates to topography mapping of surface forces, and more particularly to a system, device and method for mapping a surface using magneto-resistance.

2. Description of the Related Art

Typically, the optical detection technique is used for topography sensing at the nanometer scale, because of its high bandwidth and sub-nanometer resolution capability. However, such setups are expensive and bulky. The optical detection concept is not suitable for batch fabrication of large arrays of integrated sensors, which are required for parallel operation to provide high throughput in nano-scale probing systems, with applications in lithography, storage, and nano-fabrication.

Other sensing concepts, e.g., thermo-electric and piezo-resistive, provide a solution to this problem, as they can be fabricated in integrated form. However, all such known concepts suffer from either low bandwidth (thermo-electric) or low resolution (piezo-resistive) or both of the problems. Therefore, a new solution is needed that combines the advantages of optical sensing with the miniaturization and integration capability of the latter techniques.

SUMMARY

A topography sensor and method include a probe configured to traverse a surface to determine a topography. Nanometer scale spatial and temporal resolution is achieved by utilizing a nanometer scale sharp probe tip and a probe deflection detection sensor having nanometer scale resolution. A magnetic field is disposed in proximity to the probe by using a permanent magnet, magnetic layer or a current-loop, etc. A magneto-resistive sensor is configured so that the stray magnetic field passing through the sensor changes in accordance with positional changes of the probe as the probe tip traverses the surface.

A method for topography sensing includes providing a stray magnetic field disposed in proximity to a probe; traversing a surface with the probe; and sensing changes in the stray magnetic field in accordance with positional changes of the probe as the probe traverses the surface using a magneto-resistive sensor.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
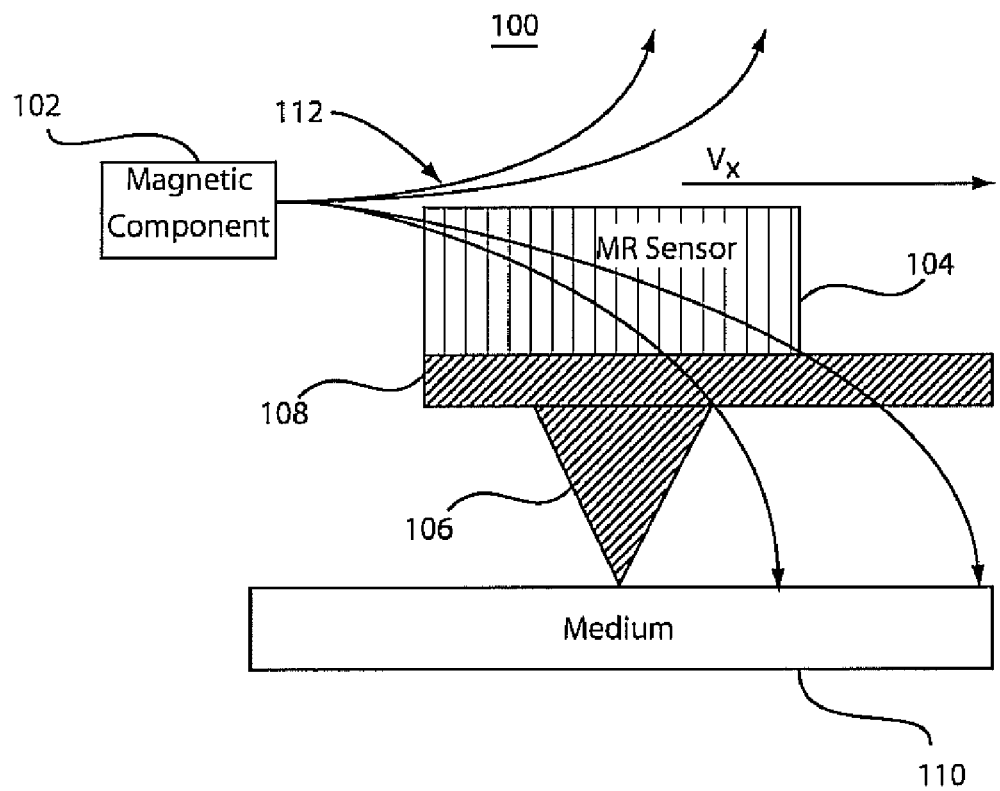
FIGS. 1A-B are cross-sectional views showing a magnet and a sensor sensing topographical changes on a medium in accordance with the present principles.

The present principles provide new techniques for topography sensing (including surface forces such as van der Waals, electric and magnetic forces, etc.) with high bandwidth and high resolution. The present principles provide the capability to include integrated sensors. The sensors can be fabricated, e.g., using existing micro-electro-mechanical-systems (MEMS)-based fabrication processes. Particularly useful embodiments offer the combined potential for high bandwidth, well in excess of 1 MHz, and high resolution at the sub-nanometer level.

One application of high bandwidth and high resolution integrated sensors lies in probe-based high density data storage, especially in applications where high data-rate is paramount, as, for example, in archival storage. In particular, the field of archival storage is currently dominated by magnetic tape, which is expected to extend, in current form, for another 5-10 years. Around that time, tape heads will take the form of dense arrays of miniature heads, bundled together to read magnetically sub-micrometer sized information carriers (domains) in a storage medium of a particular structure. As such, ways to sense some medium property (magnetic flux, topography, etc.) with magnetic means, such as the one in accordance with the present principles, gain significant importance for the scaling of established technologies in the area of archival storage.

Embodiments of the present invention can take the form of an entirely hardware embodiment, an entirely software embodiment or an embodiment including both hardware and software elements. In a preferred embodiment, the present invention is implemented in hardware with software support. The software may include but is not limited to firmware, resident software, microcode, etc.

Furthermore, aspects of the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The sensors as described herein may include of be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 1B:
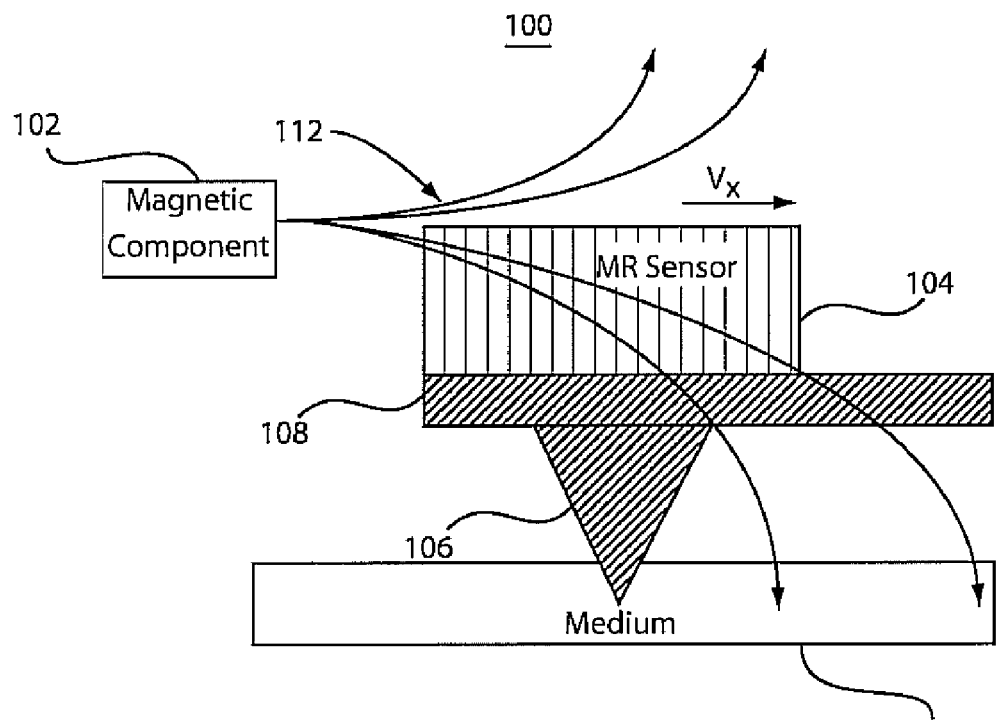

Referring now to the drawings in which like numerals represent the same or similar elements and initially to FIGS. 1A and 1B, a sensing device 100 is illustratively shown. Sensing device 100 is employed to measure non-magnetic surfaces although magnetic surfaces may be measured as well with an appropriate configuration of the magneto resistive sensor, probe and the micro-magnet. Sensing device 100 is based on magneto-resistive (MR) sensing which is used for measuring stray magnetic fields. MR sensor 100 provides both high bandwidth (e.g., greater than 1 MHz) and high resolution (e.g., less than 1 nm).

Device 100 may include a plurality of different configurations where a magnetic component 102 and magneto resistive (MR) sensor 104 are employed, but may have their locations transposed or their locations may be altered or integrated into different components of the designs. For illustrative purposes, one preferred embodiment is depicted in FIGS. 1A and 1B.

It should be understood that magnetic component 102 may include a magnetic field or any device that generates a magnetic field. For example, magnetic component (hereinafter magnet for simplicity) 102 may include a permanent magnet, a magnetic layer, a current loop or coil, an inductor, etc.

Magneto-resisitive (MR) sensing may employ any sensor 104 belonging to the MR sensing family, e.g., Anisotropic Magneto-Resistive (AMR), Giant Magneto-Resistive (GMR), Tunnel Magneto-Resistive (TMR), etc.). These MR sensors may be employed to probe a stray field 112 of a magnet in different architectures for topography sensing. When a tip 106 of a microcantilever 108 traverses over nanometer-scale features of a sample surface or medium 110, there is a change in a magnetic field B (indicated by stray-field vector, $V_x$) passing through the MR sensor 104 due the deflection of the microcantilever 108 with respect to the stray magnetic field 112 from the magnet 102. The magnetic field $V_x$ changes between FIG. 1A and FIG. 1B as the microcantilever 108 is deflected. The MR sensor 104 senses resistance changes ($\Delta R$) versus the magnetic field (B and/or $V_x$). The sensitivity $\Delta R/R > 10^{-2}$/nm.

Topography variations induce a modulation of the magnetic field $V_x$, which is sensed by the MR sensor 104. Either the magnet 102 or the MR sensor 104 may be placed at the end of the microcantilever 108. The other of the magnet 102 or the MR sensor 104 is fixed on the cantilever or to a nearby structure. To optimize the arrangement, the magnetic field strength ($V_x$) and/or the orientation of the MR sensor 104 are selected so as to provide a highest sensitivity. As the tip 106 traverses the topography of medium 110, the magnetic field strength through the MR sensor changes, and the topography signal is generated.

With different designs of the microcantilever 108 and topological configurations of the MR sensor 104 and magnet 102, a high bandwidth and high resolution topography imaging signal can be obtained. For parallel operation of arrays of microcantilevers 108, one possible embodiment of the present sensing scheme would be to integrate micromagnets and MR sensors on the same microcantilever structure.

A type of magneto resistive sensor, i.e., giant magneto resistive (GMR) sensor is a stack including anti-Ferro magnetically pinned layers and soft magnetic free layers having conductive nonmagnetic inter-layers. In a high resistance state, i.e., in the absence of an external magnetic field the magnetic moments in the two magnetic layers are opposite to each other due to ferromagnetic coupling. In the presence of an external magnetic field, the magnetic moment of the magnetically free layer aligns itself in the direction of the external magnetic field by overcoming the anti-Ferro magnetic coupling. Due to interfacial spin-polarized scattering between the ferromagnetic layers separated by conductive layers, the electrical resistance of the sensor changes. The resistance varies as a cosine function of the angle between the magnetic moments of the pinned layer and the free layer. The thinner the layers, the higher the resistance change is. The maximum resistance change of a GMR sensor is typically between 10% and 20% and can be as high as 110% at room temperature.

When the probe tip traverses the surface, the stray magnetic field through the magneto resistive sensor changes. The magnetic moment of the soft layer aligns itself along the component of the stray magnetic field in its plane and the resistance of the sensor changes. Typically, a constant current is passed through the sensor and voltage output from the sensor is used as the imaging signal.

The sensitivity and resolution of topography sensing scales proportionally to the sensitivity and resolution of the magneto resistive sensor. The sensitivity of the present methods is improved by tuning the spatial distribution of the stray magnetic field through the magneto resistive sensor to exploit the full range of operation of the MR sensor.

The spatial distribution of the stray magnetic field is not linear for a large range of operation (in the micrometer range).

However, for all practical purposes, the imaging signal can be assumed a linear function of the topography of surfaces. For large motion of the probe, the mapping between the imaging signal and the topography is a static nonlinear map which can be used to interpret the imaging signal. This method senses the movement of the probe tip similar to the optical deflection method. Various image processing techniques such as those employed on the optical deflection signal may be utilized to interpret the imaging signal from the magneto resistive sensor.

The sensitivity/resolution may be optimized by trial and error, by computation, by design, by experience or combinations thereof. Magneto resistive sensors usually operate at low field strengths starting from zero Oersted to a few hundreds of an Oersted. At higher field strengths, the soft magnetic layers get saturated and the sensor loses sensitivity. The stray magnetic field at the MR sensor in its sensitive direction can be oriented by carefully choosing the shape, size and material of a permanent magnet, and the relative position of the magnet with respect to the MR sensor. The stray magnetic field at the MR sensor can also be oriented by using combinations of more than one permanent magnet, magnetic layer and current loop. Magnetism simulation tools can be utilized to simulate various configurations and compute the stray magnetic field.

Figure 2A:
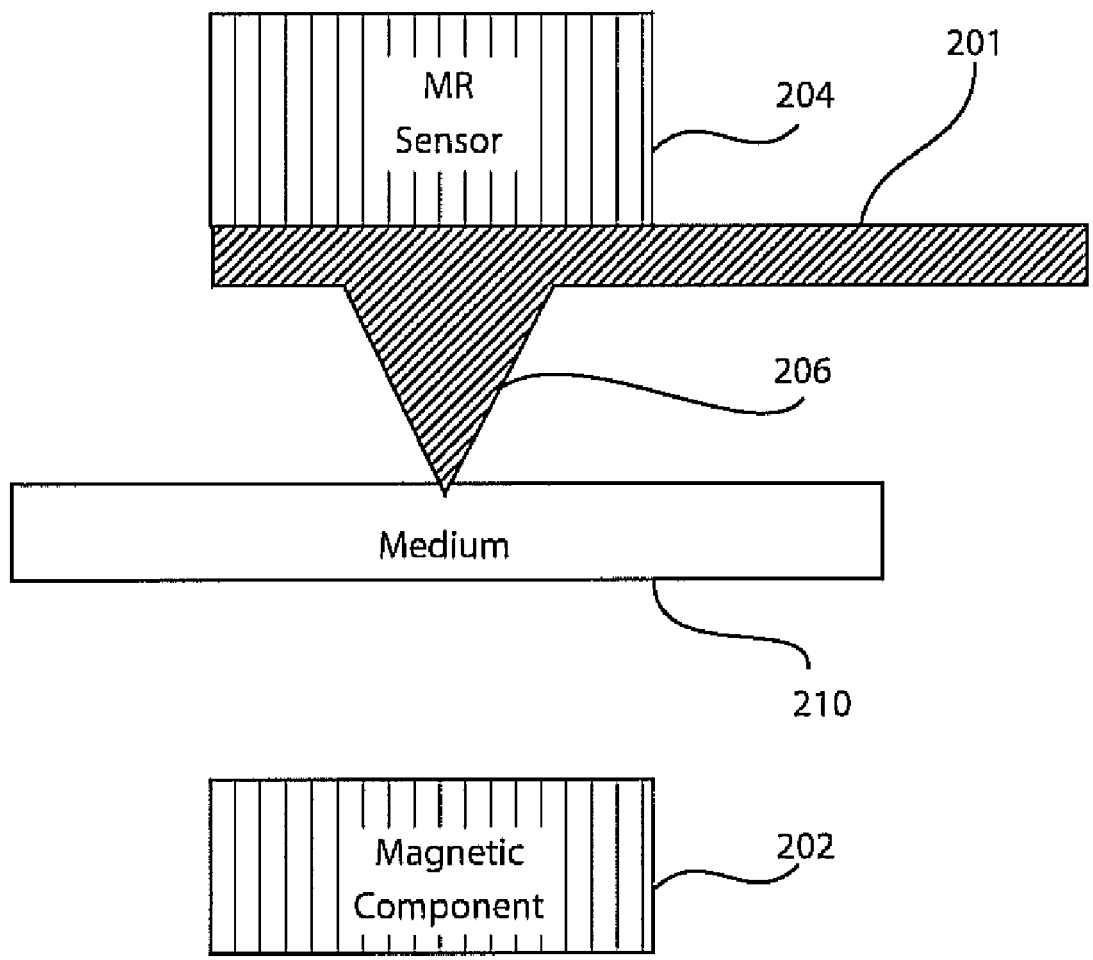
FIGS. 2A-B are cross-sectional views showing a magnet and a sensor on opposite sides of a medium.
Figure 2B:
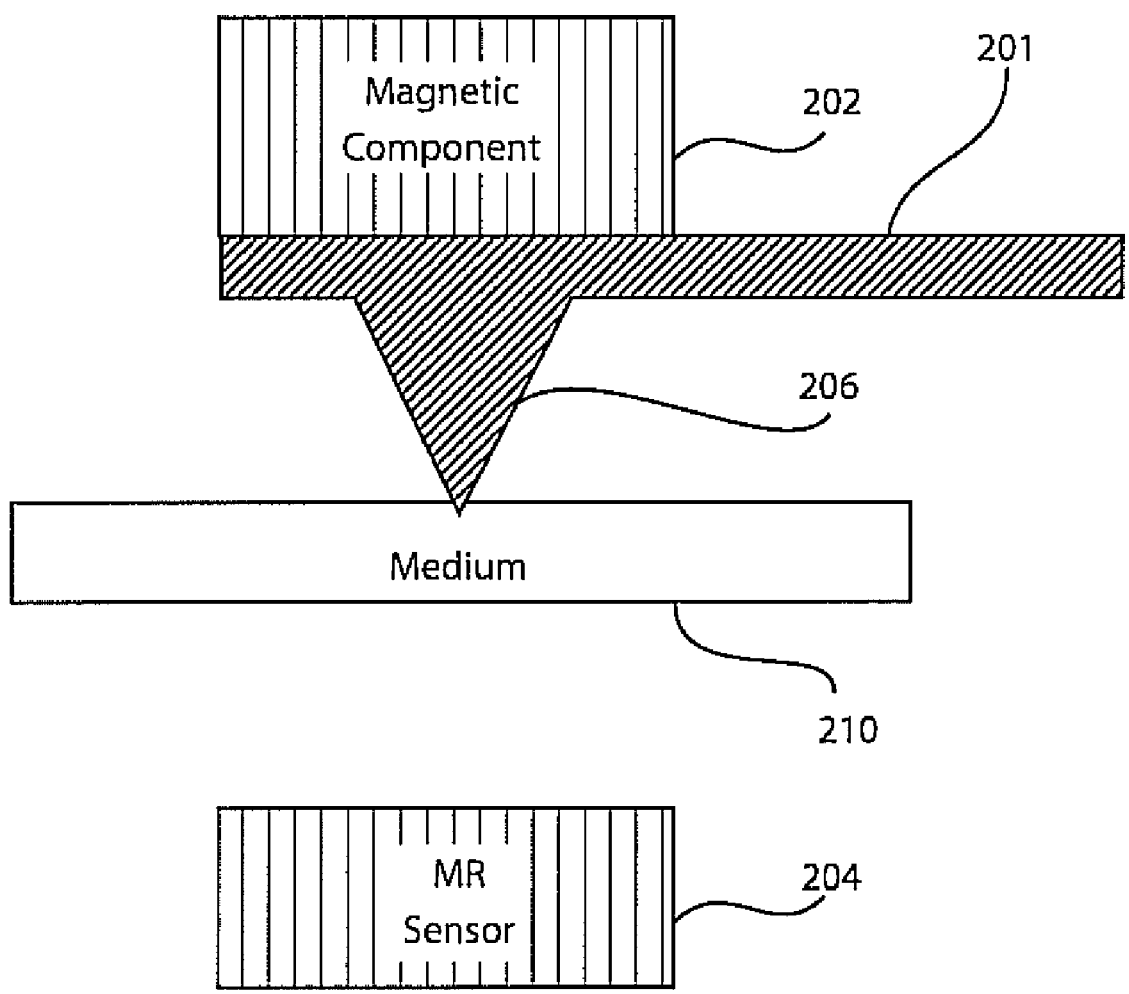

The medium and the topography thereof advantageously may include non-magnetic materials. Referring to FIGS. 2A and 2B, cross-sections of an illustrative MR topography sensing device 200 are shown. FIG. 2A shows an MR sensor mounted on the cantilever 201 while FIG. 2B shows a magnet 202 mounted on the cantilever 201. Either the MR sensor 204 or the magnet 202 may be mounted on the cantilever 201. A tip 206 is coupled to the cantilever 201 and contacts a surface of a sample or movable medium 210 to be topographically measured or mapped. The sample 210 may include a printed circuit board (PCB), an integrated circuit, a biological material, or any other non-magnetic material. The magnet 202 (FIG. 2A) or the sensor 204 (FIG. 2B) is fixed on an opposite side of the medium 210, opposite the tip 206. The other of the sensor 204 or the magnet 202 is fixed to the cantilever 201. During operations, the medium 210 is moved relative to the tip 206 and the vertical tip movement is measured using the sensor 204. FIGS. 2A-2B may be employed in archival storage applications although other applications are also contemplated.

Figure 3A:
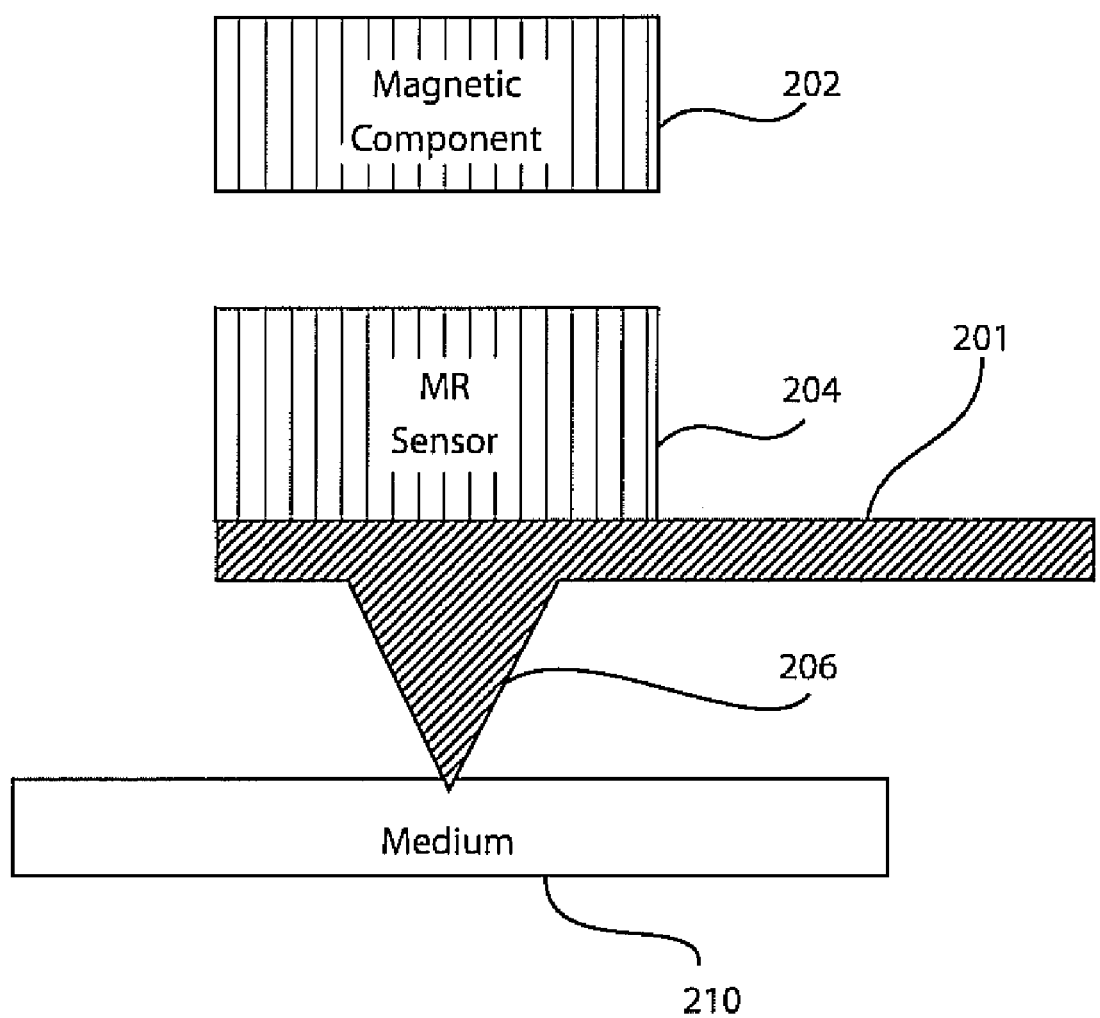
FIGS. 3A-B are cross-sectional views showing a magnet and a sensor spaced apart on a same side of a medium.
Figure 3B:
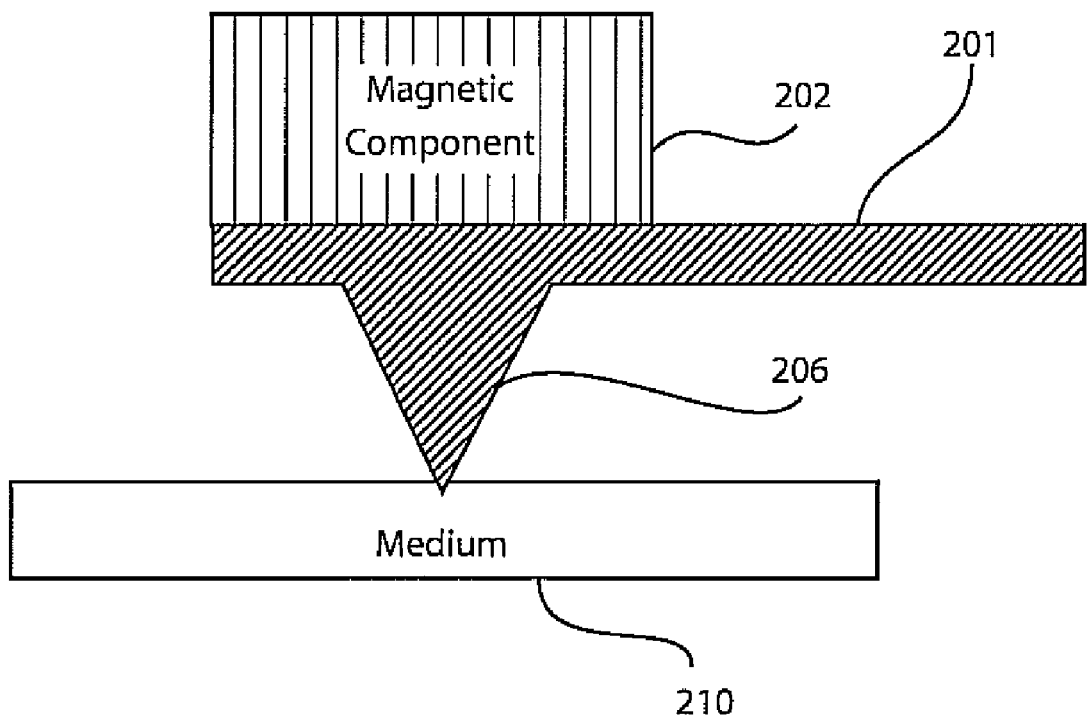

Referring to FIGS. 3A and 3B, cross-sections of an illustrative MR topography sensing device 300 are shown. FIG. 3A shows an MR sensor 204 mounted on a cantilever 201 while FIG. 3B shows a magnet 202 mounted on the cantilever 201. The MR sensor 204 or the magnet 202 may be mounted on the cantilever 201. A tip 206 is coupled to the cantilever 201 and contacts a surface of a sample or movable medium 210 to be topographically measured or mapped. The sample 210 may include a printed circuit board (PCB), an integrated circuit, a biological material, or any other non-magnetic material. The magnet 202 is spaced apart from the sensor 204 (FIG. 3A) on a same side of the medium 210. In FIG. 3B, the sensor 204 is spaced apart from the magnet 202. During operations, the medium 210 is moved relative to the tip 206 and the vertical tip movement is measured using the sensor 204. FIGS. 3A-3B may be employed in mobile storage applications although other applications are also contemplated.

Figure 4A:
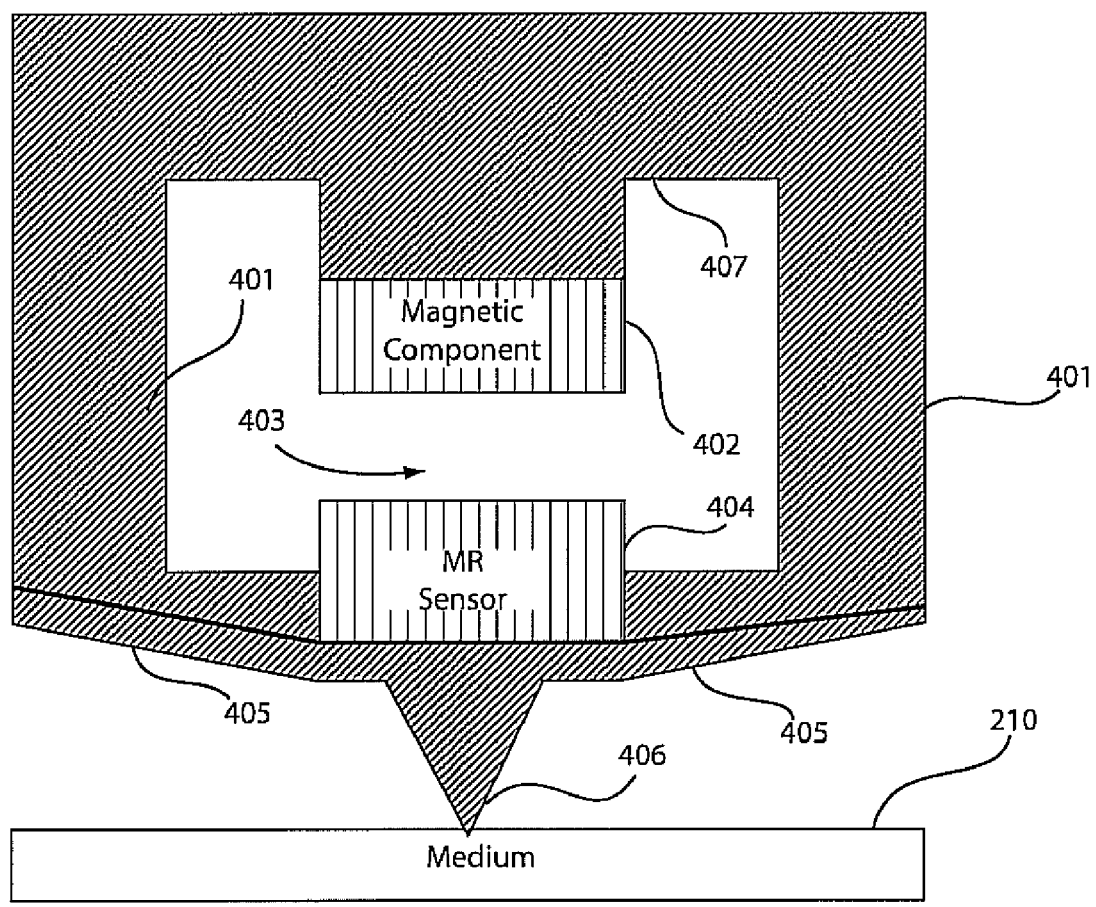
FIGS. 4A-B are cross-sectional views showing a frame structure having a magnet and a sensor integrated therein.
Figure 4B:
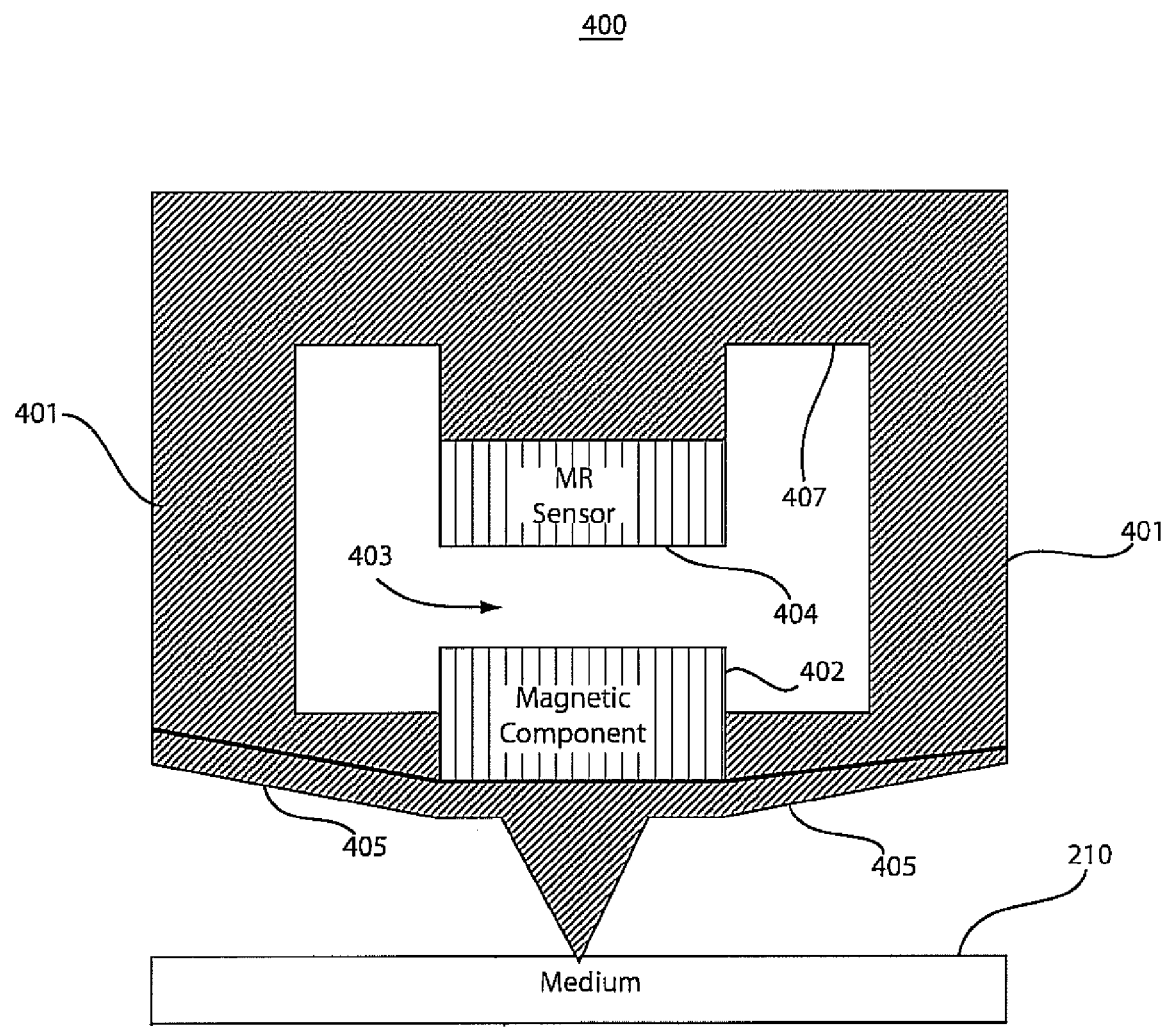

Referring to FIGS. 4A and 4B, cross-sections of another illustrative MR topography sensing device 400 are shown. Device 400 includes a rigid beam 407 and a cantilever which has two legs 401 connected by a beam 405. The device 400 includes a gap or free space 403 between the magnet 402 and the sensor 404. The cantilever including its two legs 401 and connecting beam 405 function as a spring element (similar to cantilever 201). A tip 406 is coupled to the beam 405 and contacts a surface of a sample or movable medium 210 to be topographically measured or mapped. Deflections of the tip 406, in response to the movement of the medium 210, cause fluctuations in the magnetic field as before.

In FIG. 4A, the magnet 402 is attached to the support arms 405 and held across the gap 403 from the sensor 404 within a frame formed by legs 401 and beam 407. The magnet 402 and the magneto resistive sensor element 404 are integrated on the same cantilever structure to make the topography sensor. During operations, the medium 210 is moved relative to the tip 406 and the vertical tip movement is measured using the sensor 404 because it moves with respect to the magnet 402 along with the tip 406.

In FIG. 4B, the sensor 404 is attached to the support arms 405 and the magnet 402 is held across the gap 403 from the sensor 404 within the frame formed by legs 401 and beam 407. The magnet 402 and the sensor 404 within the frame move together on the same side of the medium 210. During operations, the medium 210 is moved relative to the tip 406 and the vertical tip movement is measured using the sensor 404 because the magnet 402 moves with respect to the sensor 404 along with the tip 406.

The structures and methods of the present invention offer at least the following substantial advantages over the known solutions in topography sensing. 1) Very high bandwidth: At low-cost and miniature form-factors, in contrast to the bulky and expensive optical setups. 2) Very high resolution: The resolution of the magnetic sensing scheme can theoretically match the sub-nanometer resolution of optical sensing, by appropriate placement of sensor and magnet and miniaturization of both. 3) Potential for MEMS fabrication at low-cost: as opposed to optical sensing which requires bulky and expensive components The present magneto-resistive topography sensing techniques combine all the above-mentioned desirable features, e.g., a small form-factor and integrated fabrication of thermo-electric or piezo-resistive sensing, as well as the superb bandwidth/resolution performance of optical sensing. Advantageously, MR sensors are employed herein for measuring topography of a non-magnetic surface.

Having described preferred embodiments of a system and method for magneto-resistance based topography sensing (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:
1. A topography sensor, comprising:
a probe configured to traverse a surface to determine a topography of the surface; and
a magneto-resistive sensor configured to sense changes in a stray magnetic field in accordance with positional changes of the probe as the probe traverses the surface and to sense the changes with a sub-nanoscale resolution.
2. The sensor as recited in claim 1, wherein the probe includes a tip and a cantilever arm.

3. The sensor as recited in claim 1, wherein the stray magnetic field is generated by a magnetic component and the magnetic component is attached to the cantilever arm.

4. The sensor as recited in claim 3, wherein the surface is included on a medium having a surface side and an opposite side and the magneto-resistive sensor is disposed on the opposite side of the medium.

5. The sensor as recited in claim 3, wherein the magnetic component is disposed between the surface and the magneto-resistive sensor.

6. The sensor as recited in claim 2, wherein the magneto-resistive sensor is attached to the cantilever arm.

7. The sensor as recited in claim 6, wherein the stray magnetic field is generated by a magnetic component and the surface is included on a medium having a surface side and an opposite side and the magnetic component is disposed on the opposite side of the medium.

8. The sensor as recited in claim 6, wherein the magneto-resistive sensor is disposed between the surface and the magnetic component.

9. The sensor as recited in claim 1, further comprising a frame configured to support a magnetic component employed to generate the stray magnetic field and the magneto-resistive sensor to provide an air gap therebetween, the frame including at least one arm portion to support the probe.

10. The sensor as recited in claim 9, wherein one of the magnetic component and the magneto-resistive sensor is mounted on the at least one arm portion.

11. The sensor as recited in claim 1, wherein the stray magnetic field is generated by at least one of a permanent magnet, a magnetic layer and a current-loop.

12. A method for topography sensing, comprising:
providing a stray magnetic field disposed in proximity to a probe;
traversing a surface with the probe;
sensing changes in the stray magnetic field in accordance with positional changes of the probe as the probe traverses the surface using a magneto-resistive sensor; and
processing an imaging signal output by the sensor by interpreting the imaging signal as a linear function of a topography of the surface.

13. The method as recited in claim 12, wherein the probe includes a tip and a cantilever arm and further comprising contacting the tip with the surface.

14. The method as recited in claim 12, wherein providing a stray magnetic field including attaching a magnetic component to the probe.

15. The method as recited in claim 14, wherein the surface is included on a medium having a surface side and an opposite side and further comprising disposing the magneto-resistive sensor on the opposite side of the medium.

16. The method as recited in claim 14, wherein providing a stray magnetic field includes providing the magnetic component between the surface and the magneto-resistive sensor.

17. The method as recited in claim 12, further comprising attaching the magneto-resistive sensor to the probe.

18. The method as recited in claim 17, wherein the surface is included on a medium having a surface side and an opposite side and providing a stray magnetic field includes providing a magnetic component on the opposite side of the medium.

19. The method as recited in claim 17, wherein the magneto-resistive sensor is disposed between the surface and a magnetic component used to generate the stray magnetic field.

20. The method as recited in claim 12, further comprising integrating a magnetic component used to generate the stray magnetic field and the magneto-resistive sensor in a frame configured to provide an air gap between the magnetic component and the magneto-resistive sensor, the frame including at least one arm portion to support the probe.

21. The method as recited in claim 20, wherein one of the magnetic component and the magneto-resistive sensor is mounted on the at least one arm portion.

* * * * *